(12) United States Patent
Thoss et al.

(10) Patent No.: US 8,441,251 B2
(45) Date of Patent: May 14, 2013

(54) PROXIMITY SENSOR

(75) Inventors: Sascha Thoss, Freiburg (DE); Andre Lissner, Freiburg (DE); Olaf Machul, Freiburg (DE)

(73) Assignee: Sick AG, Waldkirch/Breisgau (DE)

( * ) Notice: Subject to any disclaimer, the term of this patent is extended or adjusted under 35 U.S.C. 154(b) by 604 days.

(21) Appl. No.: 12/705,069

(22) Filed: Feb. 12, 2010

(65) Prior Publication Data

US 2010/0207611 A1    Aug. 19, 2010

(30) Foreign Application Priority Data

Feb. 13, 2009    (DE) .................. 10 2009 008 787

(51) Int. Cl.
*G01B 7/14*    (2006.01)
(52) U.S. Cl.
USPC ............. 324/207.15; 324/207.17; 324/207.22
(58) Field of Classification Search ............. 324/207.15, 324/207.17, 207.22
See application file for complete search history.

(56) References Cited

U.S. PATENT DOCUMENTS

| | | |
|---|---|---|
| 5,264,733 A | 11/1993 | Tigges |
| 5,557,206 A | 9/1996 | Won |

FOREIGN PATENT DOCUMENTS

| | | |
|---|---|---|
| DE | 38 39 386 A1 | 5/1990 |
| DE | 40 31 252 C1 | 10/1991 |
| DE | 43 11 973 A1 | 2/1997 |
| DE | 197 40 774 C2 | 3/1998 |
| DE | 198 50 749 C1 | 3/2000 |
| DE | 100 03 913 A1 | 10/2001 |
| DE | 101 22 741 A1 | 11/2002 |
| DE | 103 50 733 A1 | 5/2005 |
| DE | 20 2006 003 600 U1 | 9/2007 |
| DE | 10 2006 053 222 A1 | 5/2008 |
| WO | 2007/012502 A1 | 2/2007 |

*Primary Examiner* — Reena Aurora
(74) *Attorney, Agent, or Firm* — Nath, Goldberg & Meyer; Jerald L. Meyer; Scott C. Langford

(57) ABSTRACT

The present invention relates to a proximity sensor having a first transmission coil, a second transmission coil, at least one reception coil, an excitation device which is connected to the first and second transmission coils, and an evaluation unit which is connected to at least one transmission coil and/or to the excitation device as well as to the at least one reception coil.

20 Claims, 5 Drawing Sheets

PROXIMITY SENSOR

Figure 1:
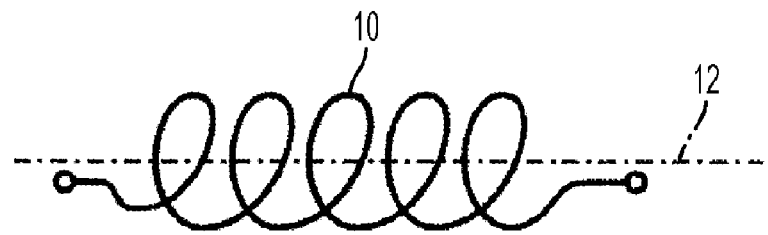

The present invention relates to a proximity sensor, in particular to an inductive proximity sensor.

Such inductive proximity sensors serve for the recognition of a body, in particular a metallic body or a body with good electrical conductivity, called a target, which is introduced into a region of influence of the proximity sensor. Conventional proximity sensors comprise an oscillator which includes a coil which generates a magnetic field when the oscillator is oscillating. Eddy currents are induced in a target to be detected which is introduced into the magnetic field and generate a counter-field directed against the magnetic field and thus withdraw energy from the oscillator. The oscillator in the known proximity sensors is dimensioned so that this energy withdrawal results in the collapse of the oscillation of the oscillator at a specific target distance. This procedure is then detected for the purpose of the detection of the target.

Such proximity sensors as a rule have a switching distance which is too small for specific applications. The switching distance designates the maximum distance of a target from the proximity sensor at which a detection of the target by the sensor is still reliably possible.

An inductive proximity sensor is known from DE 38 39 386 A1 which has a transmission coil for the generation of an alternating field as well as a reception coil in which a voltage is induced by the alternating field. Provision is made in this respect that a change in the voltage which is induced in the reception coil and which is caused by an introduction of a target into the magnetic field and the change in the magnetic field resulting therefrom is sensed for the detection of the target.

An inductive proximity sensor is known from DE 197 774 C2 having two transmission coils arranged behind one another in the direction of influence and having at least one reception coil in which the two transmission coils are supplied with current in opposite senses.

A detector for the location of metallic objects is known from DE 101 22 741 A1 which has a first and second transmission coil and a reception coil, with the two transmission coils and the transmission currents fed into them being designed so that the flows excited in the reception coil by the two transmission coils mutually compensate one another.

An apparatus is known from WO 2007/012502 A1 for the measurement of the transit time of capacitive or inductive fields in which clocked signals from at least two elements in the form of electrodes or coils generating field changes are supplied to a receiver. A complex regulation electronic system is necessary in this apparatus.

The concepts known in accordance with the prior art have the disadvantage that they only allow limited switching distances and an only limited sensitivity.

It is the underlying object of the invention to provide an inductive proximity sensor which has an increased sensitivity, enables increased switching distances with respect to the prior art and can additionally be manufactured at reduced costs.

An inductive proximity sensor having the features of claim 1 is provided to satisfy this object.

The inductive proximity sensor in accordance with the invention has a first transmission coil and a second transmission coil as well as at least one reception coil, an excitation device which is connected to the first and second transmission coils and an evaluation device which is connected to at least one transmission coil and/or to the excitation device, on the one hand, and to the at least one reception coil, on the other hand and which is designed to generate an evaluation signal which depends on a phase shift between a signal of at least one transmission coil and/or of the excitation device on the one hand and a signal of the at least one reception coil on the other hand.

Particularly high switching distances and high sensitivities are achieved on the basis of this design of the inductive proximity sensor in accordance with the invention.

Before looking at the operation of the proximity sensor in accordance with the invention, its components should first be explained in more detail.

The inductive proximity sensor in accordance with the invention has a first transmission coil and a second transmission coil which are both electrically connected to an excitation device and are excited by it.

Within the framework of the invention, the excitation device can be comprised of one unit or also have a plurality of components electrically connected to one another and spatially separate. The excitation device can additionally have a single voltage source or current source for the excitation of the first and second transmission coils or can have a separate voltage source or current source in each case for the excitation of the first and of the second transmission coil, with a synchronization of the voltage sources or current sources being able to be ensured via a suitable electronic coupling in the case of a plurality of voltage sources or current sources. Accordingly, the excitation signal which the excitation device exerts on the first and second transmission coils can be identical for both transmission coils or different for both transmission coils. In the case of different excitation signals for both transmission coils, these excitation signals can then in particular be synchronized so that they have a preset phase shift.

When a current source is mentioned in the following, a voltage source can generally also be used instead of this current source.

The first and second transmission coils are each inductively coupled to the at least one reception coil. The temporally changing magnetic fields which are generated by the excitation of the first and second transmission coils thereby induce a voltage in the reception coil.

An evaluation device is furthermore provided in accordance with the invention which is electrically connected to at least one of the transmission coils and/or to the excitation device, on the one hand, and to the at least one reception coil, on the other hand, and receives and evaluates a signal of at least one of the transmission coils and/or of the excitation device as well as a signal of the at least one reception coil. This signal evaluation then generates an evaluation signal in a manner still to be explained in more detail which depends on a phase shift between a signal of at least one transmission coil and/or the excitation device, on the one hand, and a signal of the at least one reception coil, on the other hand and which contains information on an approach of a target to the proximity sensor or on the distance of the target from the proximity sensor, respectively.

It was recognized in accordance with the invention that a phase shift between the voltage or current signal induced in the reception coil (secondary signal), on the one hand, and a signal of the excitation device and/or a signal of a transmission coil (primary signal), on the other hand, changes very much when a target is introduced into the detection region of the proximity sensor, so that the phase shift represents a very sensitive measure for the presence of a target and/or—if a distance measurement is desired—the target distance and therefore allows for high switching distances. Depending on the design of the proximity sensor, for example a phase transition of 180 degrees can occur at a specific target distance, wherein this target distance can be very high. Such a phase shift or phase transition can be detected by the proximity sensor so that the proximity sensor has a correspondingly high switching distance.

Advantageous embodiments of the invention are set forth in the dependent claims, in the description and in the drawings.

The transmission coils are preferably designed and arranged so that one of the two transmission coils is inductively coupled more strongly to a target spaced apart from the proximity sensor in a direction of influence of the proximity sensor than the other transmission coil. Inductively coupled differently strongly to the target in the sense of the invention means that the counter-inductivities which the two transmission coils respectively form with the target are different. In this respect, in particular the inductive coupling factors between the target and the two transmission coils can also be different. A particularly significant change in the phase shift can be ensured by this design in dependence on the presence or on the distance of a target.

In accordance with a further advantageous embodiment, the two transmission coils can be designed, arranged and excited and the reception coil can be designed and arranged so that a transmission function of the proximity sensor has a zero point at a target located at a preset, finite switching distance from the proximity sensor in the direction of influence of the proximity sensor. The transmission function of the proximity sensor in this respect represents a relation between a signal of the reception coil and a signal of a transmission coil in dependence on a target approaching the proximity sensor.

This means, in other words, that the two transmission coils are designed, arranged and excited and the reception coil is designed and arranged so that a current signal or transmission signal induced in the reception coil by the transmission coils and by an expected target to be detected is cancelled out when the expected target to be detected is located at a preset switching distance from the proximity sensor in the direction of influence of the proximity sensor. For this purpose, the mutual counter-inductivities and inductive coupling factors between the reception coil, the transmission coils and the target must be suitably adapted in dependence on the excitation of the transmission coils, which will be explained in more detail within the framework of the description of the Figures.

The signal of the reception coil is in this respect, for example, the induced current signal or voltage signal applied to the reception coil and the signal of the transmission coil is, for example, the current signal or voltage signal which is applied to the transmission coil. On a use of a plurality of reception coils, the signal of the reception coil can be a signal which is derived or combined from a plurality of current signals or voltage signals of different reception coils; for example, in a series connection of a plurality of reception coils, the voltage over the series connection. The signal of a transmission coil can equally be a combined signal from signals of a plurality transmission coils such as a voltage over a series of transmission coils.

A zero point as described above of the transmission function at a preset switching distance has the advantage that a particularly strong dependence of the phase shift on the presence and on the distance of a target to be detected results in the environmental region of the proximity sensor disposed within the switching distance. In this way, the presence of a target located at a defined switching distance can be particularly reliably detected. The distance of a target located in the region of the switching distance can equally be particularly exactly detected. A particularly high sensitivity of the proximity sensor can thus be ensured in the region of the preset switching distance.

In this respect, the preset switching distance corresponding to the zero point can preferably be selected so that it corresponds to a maximum distance from the proximity sensor in the direction of influence in which a target to be detected is expected, or is slightly larger, so that a particularly high sensitivity is ensured in the region of interest. The preset switching distance can accordingly adopt a value, for example, in the range between 0 mm and 100 mm, preferably a value in the range between 0.5 mm and 20 mm, particularly preferably a value in the range between 1 mm and 10 mm, and most preferably a value in the range between 2 mm and 5 mm. The preset switching distance can also be selected so that it corresponds to a multiple of a diameter of one of the transmission coils or of the reception coil and is, for example, in the range of 0 to 10 times, preferably in the range of 0.1 to 8 times, particularly preferably in the range of 0.5 to 6 times and most preferably in the range of 2 to 5 times the diameter of one of the transmission coils or of the reception coil. The expected target to which the transmission function is adapted can, for example, be a partly metallic or wholly metallic body such as a metal block having an extent of a few millimeters up to a few centimeters.

The evaluation signal generated by the evaluation unit and containing information on the presence of a target at a specific distance can be used to control a function dependent on the presence or on the distance. The evaluation device is preferably designed to open or close a switch in dependence on the evaluation signal when the phase shift or the evaluation signal dependent thereon exceeds a preset threshold value, with the threshold value being able to be zero, for example. In this way, for example, a processing step dependent on the presence of a product acting as a target can be started or ended in an automated product processing procedure or a safety shutdown can be realized. The evaluation signal can equally be used to transmit a status signal on the recognition of a target to a control device which can in particular also contain information on the distance of the target from the sensor. The evaluation signal can in this respect be provided in analog or digital form at an output as a measure for a target distance.

The evaluation signal dependent on the phase shift between a signal of a transmission coil or of the excitation device and a signal of the reception coil can be generated in that both signals are received separately and are combined with one another by a corresponding evaluation circuit. It is possible in this respect, for example, to multiply both signals by a multiplier or to mix them and then in particular to integrate the resulting signal using an integrator over a preset time period such as over the duration of a preset number of period durations of the signals. A fast digital counter can also be used for generating the evaluation signal.

Using the above described evaluation methods, an evaluation signal that is at least approximately proportional to the phase shift can be generated, which is generally preferred within the framework of the invention, since the phase shift—as already mentioned—represents a very sensitive measure for the presence and the distance of a target from the proximity sensor.

A further advantageous embodiment provides that the excitation device is designed to excite at least one transmission coil with a periodic signal, preferably with an AC voltage signal and particularly preferably with a sinusoidal AC voltage signal. These signals are particularly well suited to generate a temporally changing magnetic field by a transmission coil which induces a voltage in the reception coil, whose time development has a phase shift to the exciting signal dependent on the distance of a target. The excitation device can in this respect, for example, have one or more AC current sources or one or more oscillators or one or more inverters.

In this respect, the frequency of the excitation is preferably selected so that it takes account of the geometry of the proximity sensor and of the materials used in the proximity sensor. The proximity sensor can namely have a sleeve for the accommodation of the coils, for example, and in particular a front cap of metal. In this case, the frequency of the excitation is preferably selected as so low that a sufficient penetration of the front cap by the magnetic field generated by the transmission coils is ensured.

The excitation device can alternatively likewise be designed to excite at least one transmission coil with a pseudorandom sequence, whereby the security against interference of the proximity sensor is increased.

It is furthermore preferred if the excitation device is designed to excite the first transmission coil and the second transmission coil with two excitation signals of the same amplitude, of the same signal shape and of a phase shift between −5 and 5 degrees, in particular of 0 degrees. For this purpose, the excitation device can, for example, excite both transmission coils with the same current source, with both transmission coils in particular being able to be connected in parallel and being able to be connected to a connection of the excitation device. Two different synchronized current sources can, however, also be used.

The excitation device can also be designed to excite the first transmission coil with a first excitation signal and to excite the second transmission coil with a second excitation signal, with the first excitation signal and the second excitation signal having a phase shift between 175 and 185 degrees, in particular of 180 degrees. For this purpose, the excitation device can have two current sources which deliver signals with out-of-phase signal position.

As already described above, the first transmission coil and the second transmission coil are preferably designed and arranged so that one of the two transmission coils is inductively coupled more strongly to a target approached in the direction of influence than the other transmission coil. The direction of influence of the proximity sensor designates the direction in which a detection of a target is intended and can, for example, be identical to a longitudinal axis of a cylindrical or parallelepiped sleeve in which the coils are located. Such a differently strong inductive coupling to a target approached in the direction of influence can be realized, for example, in that the first transmission coil, the at least one reception coil and the second transmission coil are arranged behind one another in the direction of influence of the proximity sensor.

Alternatively or additionally, a magnetic shielding can be provided which magnetically shields one of the transmission coils from a target spaced apart from the proximity sensor in the direction of influence and which does not magnetically shield, or shields less strongly, the other transmission coil from the target. The shielding may for example be extending transversely to the direction of influence of the proximity sensor.

It is advantageous in this respect that on the approach of a target a particularly pronounced phase shift of the signal induced in the reception coil results.

It is particularly preferred if the first transmission coil and the second transmission coil and the at least one reception coil are arranged at least substantially coaxially, in particular with the common axis of the coils extending at least substantially parallel to the direction of influence of the proximity sensor. A particularly advantageous inductive coupling of the first and second transmission coils and of the reception coil is hereby achieved which in particular results in a pronounced phase shift of the secondary signal (of the signal of the at least one reception coil) with respect to the primary signal (excitation signal). Alternatively to this, it can also be advantageous that the reception coil and a transmission coil, in particular the transmission coil inductively coupled more strongly to a target located in the region of influence of the proximity sensor, are arranged in one plane.

It is furthermore preferred if the at least one reception coil is spaced apart by at least substantially equal distances from the first and second transmission coils. In such an embodiment, a mutual cancellation of the voltage induced in the reception coil by the first and second transmission coils, such as will be described in the following, can take place in a simple manner, for example by an out-of-phase excitation of the first and second transmission coils.

In accordance with a preferred embodiment, the inductivities of the first and second coils do not differ from one another or only differ within the framework of a tolerance of preferably less than 10% and particularly preferably less than 5%, which can be due to the manufacture, for example. It is furthermore preferred if the first and second transmission coils are at least substantially identical in construction and in particular have the same number of windings, the same resistivity and the same diameter.

A particularly preferred embodiment of the invention provides that the first and second transmission coils are dimensioned and are arranged with respect to the at least one reception coil and moreover the first and second transmission coils are excited by the excitation device so that the voltages induced in the reception coil by the first transmission coil and by the second transmission coil at least substantially mutually cancel out. The means, in other words, that the transfer function of the proximity sensor which, as described above, represents a relation between a reception-coil signal (secondary signal) and a transmission-coil signal (primary signal) in dependency of the presence of a target has a zero-point at the non-presence, i.e. the absence, of a target.

In this embodiment, the voltage signal induced in the reception coil (secondary signal) is formed practically exclusively by the voltage induced by a target. This voltage is phase shifted with respect to the primary signal and is typically in the microvolt range. The voltages induced in the reception coil by the transmission coils are, in contrast, typically in the volt range. It is prevented by the mutual cancellation of the voltages induced by the transmission coils that the phase-shifted, comparatively low voltage signal which is induced by a target has a non-phase-shifted comparatively high voltage signal induced by the transmission coils superimposed on it. The detection of a phase shift in the transmission coil is thus facilitated in this embodiment. In particular an especially high sensitivity of the proximity sensor is thereby achieved and particularly high switching distances are made possible.

In the last-described embodiment, the voltage signal induced in the reception coil (secondary signal) then becomes essentially zero if there is no target in the region of influence of the proximity sensor. If there is a target in the region of influence of the proximity sensor, this becomes visible by a secondary signal which is induced in the reception coil and which has a phase shift with respect to the primary signal.

The described mutual cancellation of the voltages induced by the first and second transmission coils can, for example, be ensured in that, as mentioned above the first and second transmission coils and the reception coil are arranged behind one another coaxially in the direction of influence;

the reception coil is spaced part by equal distances from the transmission coils; and both transmission coils are identical in construction and have the same inductivities; and additionally are connected in parallel between two connections providing an excitation signal, wherein the end of the first and second transmission coils rotating to the right when viewed in the direction of influence is in each case connected to the end of the respective other transmission coil rotating to the left when viewed in the direction of influence.

That end of the coil arranged in the proximity sensor is meant by the end of a coil rotating to the right in the direction of influence starting from which the coil wire or the coil conductor extends into the coil rotating clockwise when the coil is observed in the direction of influence of the proximity sensor. Analog to this, that end of the coil is meant by an end of a coil rotating to the left in the direction of influence starting from which the coil wire or the coil conductor extends into the coil rotating counter clockwise when the coil is observed in the direction of influence of the proximity sensor.

It is achieved by the above-described coaxial arrangement of the first and second transmission coils and by their equal spacing from the reception coil that the inductive degree of coupling between the first transmission coil and the at least one reception coil is identical to the inductive degree of coupling between the first transmission coil and the at least one reception coil. It is basically preferred if the first and second transmission coils and the reception coil are dimensioned and arranged so that the inductive degree of coupling between the first transmission coil and the at least one reception coil is identical to the inductive degree of coupling between the second transmission coil and the at least one reception coil and the inductivity of the first transmission coil is identical to the inductivity of the second transmission coil.

Depending on the application, instead of or additionally to a mutual cancellation of the signals induced by the first and second transmission coils in the absence of a target, the proximity sensor can be characterized in that the first and the second transmission coils are dimensioned and are arranged relative to one another and to the at least one reception coil and moreover the first and second transmission coils are excited by the excitation device so that the voltages induced in the reception coil by the first transmission coil and the voltages induced in the reception coil by the second transmission coil and the voltages induced in the reception coil by a remote target at a specific switching distance in the direction of influence at least substantially cancel one another out, meaning that the transfer function, as described above, has a zero-point at a target that is spaced apart from the proximity sensor in the direction of influence by a preset switching distance.

In this embodiment, the secondary signal induced in the reception coil becomes essentially zero when a target is at a preset distance in the region of influence of the proximity sensor and a change in the position or distance of the target becomes visible by a secondary signal with a phase shift with respect to the primary signal.

This embodiment can, among other ways, be realized by excitation of the first and second transmission coils with a slightly different phasing or by arranging the first and second transmission coils at slightly different distances from the reception coil.

It is particularly preferred if the first transmission coil and the second transmission coil are wound and the winding sense of the first transmission coil is opposite to the winding sense of the second transmission coil. This embodiment of the coils has the effect that the sense of rotation of the current in the one transmission coil is always opposite to the sense of rotation of the current in the other transmission coil if both coils are identically excited. It can hereby be achieved particularly simply by corresponding wiring and arrangement of the transmission coils that the voltages induced in the reception coil by the first and second transmission coils cancel one another out.

In addition to wound coils with any desired winding geometry, however, generally also all conceivable other coil types, for example planar coils, can be used as well as any desired combination of coils of different type. In accordance with the invention, the coils can each comprise a single coil or a plurality of partial coils.

It is particularly advantageous in this respect if the first and second transmission coils are connected in parallel between a first and a second connection of the excitation device and if this electrical parallel connection comprises a parallel connection of a first series connection to a second series connection, with the first series connection including the first transmission coil and a first electrical resistor connected in series to the first transmission coil and the second series connection includes the second transmission coil and an electrical resistor connected in series to the second transmission coil, with in particular the first and/or second electrical resistors being an adjustable electrical resistor.

It is further preferred if a third electrical resistor is connected electrically in parallel to the first transmission coil and if a fourth electrical resistor is connected electrically in parallel to the second transmission coil, with in particular the third and/or fourth electrical resistor being an adjustable electrical resistor.

Such electrical resistors are advantageous because they effect a particularly continuous change in the phase shift of the signals evaluated in the evaluation device with the target distance and thus expand the distance range over which a determination of the target distance is reliably achieved.

In addition, the amplitude and the phase of the voltages induced in the reception coil by the transmission coils are set by such resistors. The electrical resistors can thus serve to balance any deviations in the inductivities of the transmission coils or in the distances of the transmission coils from the reception coil or other parameters of the proximity sensor with respect to the respective desired values in order also to ensure a cancellation of the voltages induced in the reception coil by the transmission coils in the case of such deviations. Electrical resistors with an adjustable resistance value are in this respect particularly advantageous because they allow an adjustment of the proximity sensor for the ensuring of the mutual cancellation of the magnetic fields generated by the transmission coils at any time, that is also after manufacture.

The first transmission coil and/or the second transmission coil can advantageously also be designed so that their inductivity is variable and can in particular be set variably at any time. A calibration and a balancing off any deviations of the coil arrangements or of other parameters is hereby made possible.

Provision can also be made that the excitation device provides an excitation signal between a first connection and a second connection and the first transmission coil and the second transmission coil are connected electrically in series between the first and second connections.

An advantageous further development in accordance with the invention provides that a first reception coil and a second reception coil are provided, with in particular the first and second transmission coils and the first and second reception coils being arranged behind one another in the direction of influence. It is particularly advantageous in this respect if one of the transmission coils alternately follows one of the reception coils in the direction of influence.

It is further preferred if the first and second reception coils are connected electrically in series.

It is particularly preferred if the first transmission coil and the first reception coil form a coil pair and if the second transmission coil and the second reception coil form a coil pair and if one of the coil pairs is arranged so that it is inductively coupled less strongly to a target located in the region of influence than the second coil pair. For this purpose, in accordance with the invention, a magnetic shielding can, for example, be provided, in particular a magnetic shielding which is arranged between the two coil pairs in the direction of influence, which extends transversely to the direction of influence and which can in particular comprise a metallic element. Such a differently strong inductive coupling can also be ensured by a different spacing of the coil pairs from a target located in the direction of influence or in that the coils of a coil pair are arranged coaxially and the common axis of this coil pair is orthogonal to a common axis of the coils of the other coil pair.

In an embodiment with one reception coil, it is advantageous, as described above, if one transmission coil is arranged so that it is inductively coupled much more weakly to a target located in the influencing region than the other transmission coil and simultaneously both transmission coils are inductively coupled approximately equally strongly to the reception coil. In an embodiment with two reception coils, both coil pairs can, as described above, be largely magnetically decoupled, for example by a magnetic shielding or by an orthogonal arrangement. A corresponding proximity sensor having two reception coils can be realized in a very compact construction form due to the reduced spacing between the two transmission coils.

It is particularly preferred if the excitation device excites the first and second transmission coils and if the transmission coils and the reception coils are arranged relative to one another and are dimensioned so that the sum of the voltages which are respectively induced in the first and second reception coils by the two transmission coils at least become essentially zero. On a series connection of the reception coils, in this embodiment, the voltage dropping over this series connection therefore becomes essentially zero.

It is ensured in this embodiment that a target located in the region of influence becomes visible in the sum of the voltages dropping at the first and second reception coils as a signal which has high phase shift with respect to the primary signal and which in particular does not have the voltages induced by the two transmission coils superimposed on it.

Alternatively or additionally, the excitation, dimensioning and arrangement of the reception and transmission coils can also be designed such that the sum of the voltages induced in the reception coils by the two transmission coils and by a target located at a specific preset switching distance in the direction of influence cancel one another out. In this case, a target having a different distance or the absence of a target becomes visible in the form of a signal in the sum of the reception coil voltages phase shifted with respect to the primary signal.

In an embodiment having two reception coils, both coil pairs can advantageously each be realized on a circuit board, in particular such that the respective transmission coil of the coil pair is realized on the upper side and the reception coil is realized on the lower side of the respective circuit board as a planar coil. One of the circuit boards can preferably include parts of the sensor electronics, that is of the excitation device and/or of the evaluation device, etc. Both planar coil pairs can likewise be arranged behind one another and can have a metal piece between them as a magnetic partition.

Figure 2:
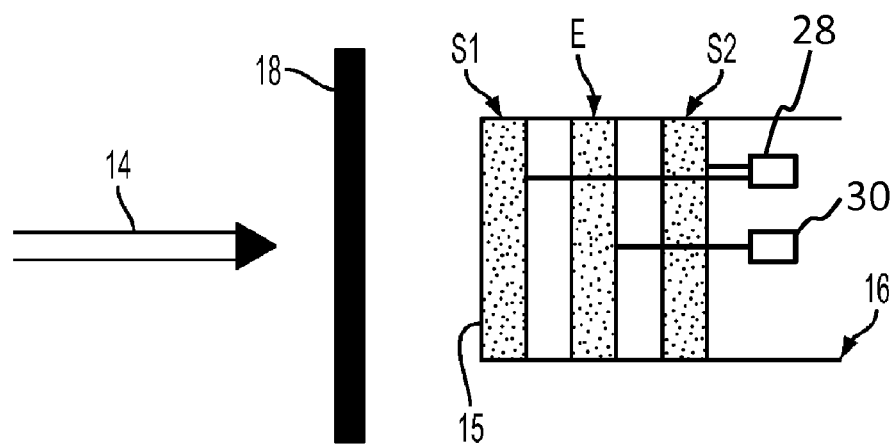
Figure 3:
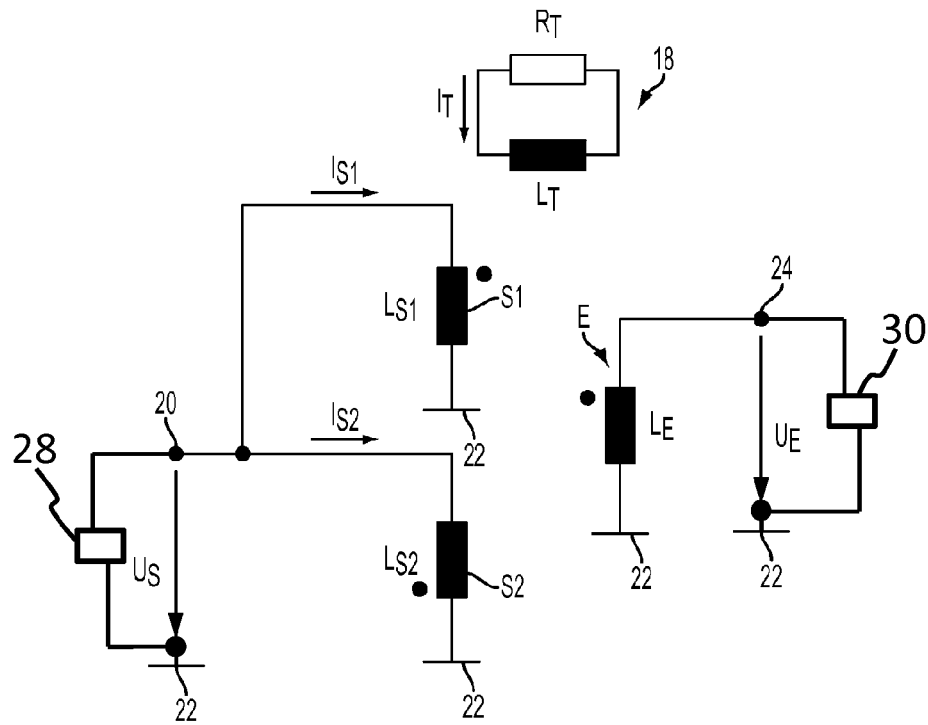
Figure 4:
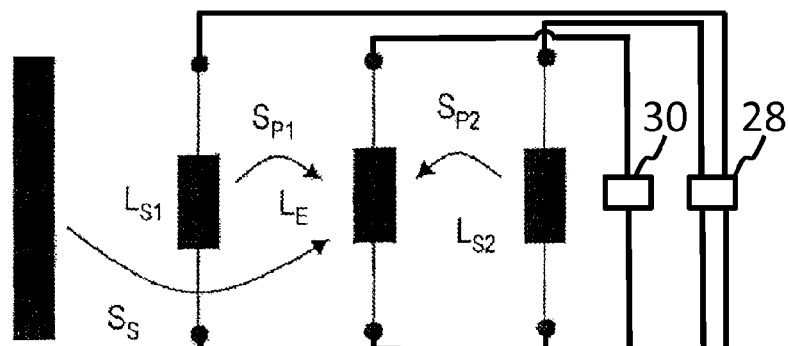
Figure 5:
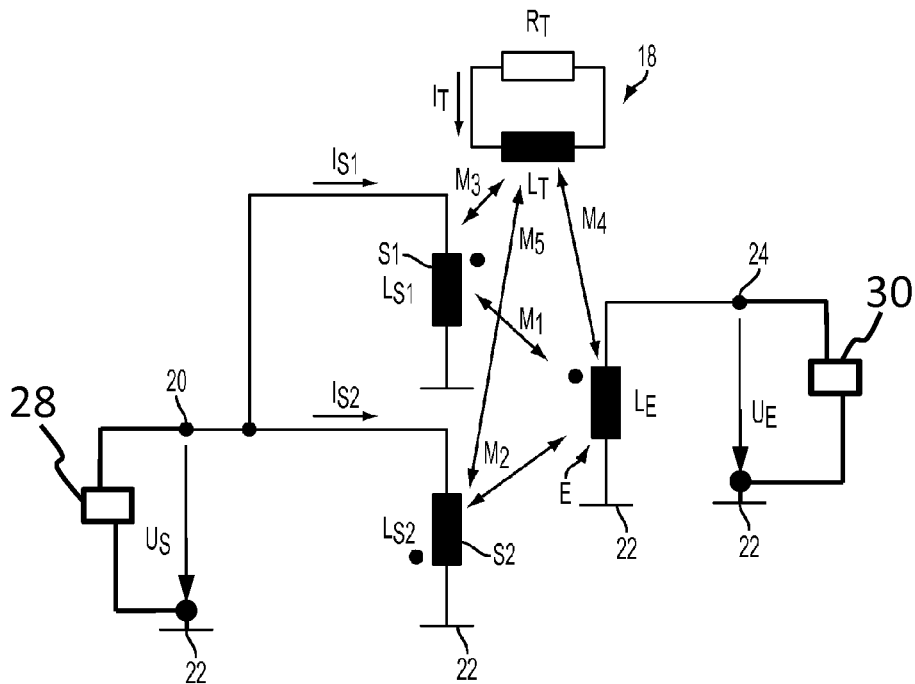
Figure 6:
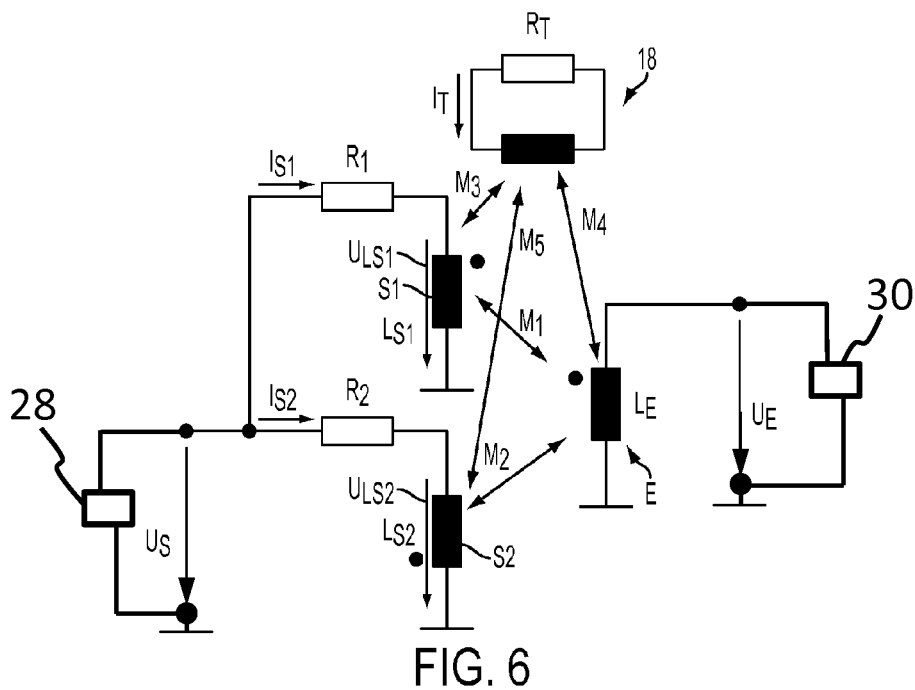
Figure 7:
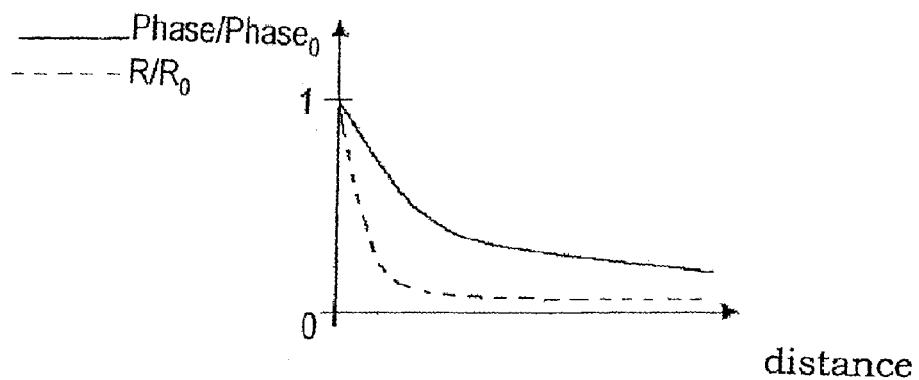
Figure 8:
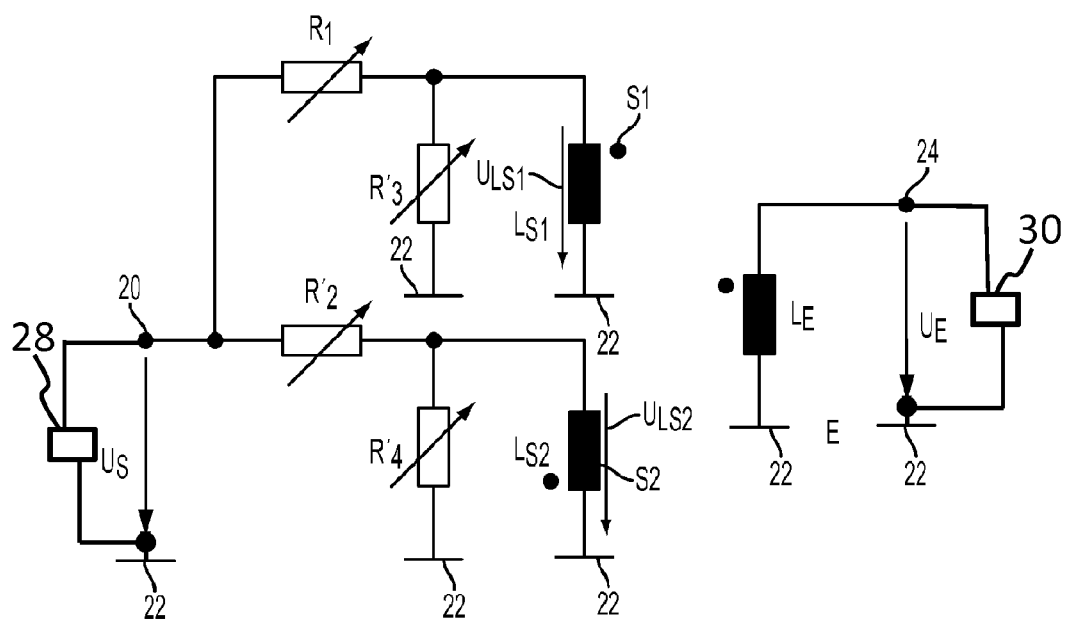
Figure 9:
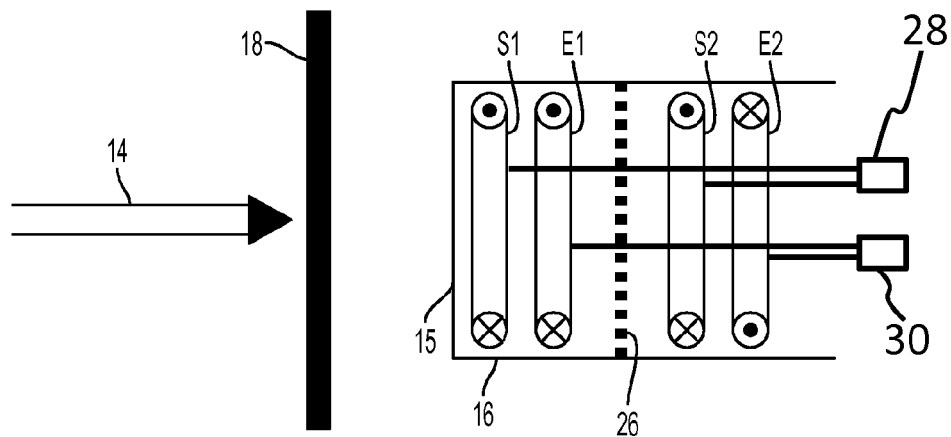
Figure 10:
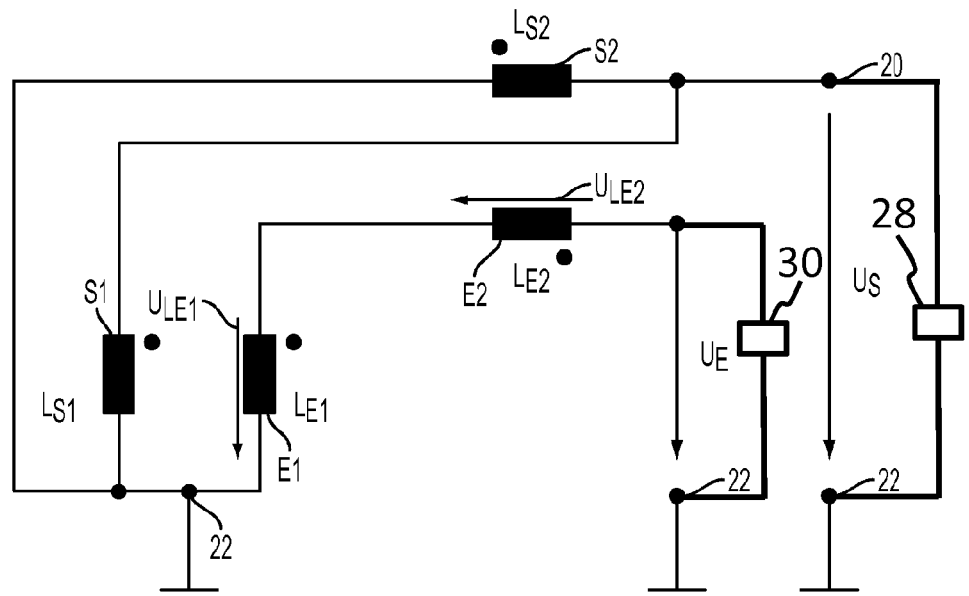

The present invention will be described in the following purely by way of example with reference to advantageous embodiments and to the enclosed drawings. There are shown:

FIG. 1 a schematic representation of a coil used in an inductive proximity sensor in accordance with the invention as a transmission coil or as a reception coil;

FIG. 2 a longitudinal section through a front region of an inductive proximity sensor in accordance with the invention and a target;

FIG. 3 a circuit diagram of the proximity sensor in accordance with the invention and of the target of FIG. 2;

FIG. 4 a representation of the induction processes between the coils of the proximity sensor in accordance with the invention and the target;

FIG. 5 the circuit diagram of FIG. 3 with marking of the counter-inductivities caused by the inductive couplings;

FIG. 6 a circuit diagram of a further proximity sensor in accordance with the invention with electrical series resistors and of a target with marking of the counter-inductivities caused by the inductive couplings;

FIG. 7 a diagram for the presentation of the dependence of a phase shift and of a loss resistance of the proximity sensor of FIG. 6 on the target distance;

FIG. 8 a circuit diagram of a further proximity sensor in accordance with the invention with adjustable electrical series resistors and adjustable electrical parallel resistors;

FIG. 9 a schematic representation of a further proximity sensor in accordance with the invention having two reception coils and a magnetic shield; and FIG. 10 a circuit diagram of the proximity sensor of FIG. 9.

FIG. 1 shows a schematic representation of a wound coil 10 such as may be considered as a transmission coil or as a reception coil for use in a proximity sensor in accordance with the invention. The longitudinal axis 12 of the coil is also shown.

FIG. 2 shows an inductive proximity sensor in accordance with the invention having a first transmission coil S1, a second transmission coil S2 and a reception coil E arranged between the transmission coils S1, S2. The three coils S1, S2 and E are designed as wound coils and are arranged coaxially, with the longitudinal axes of the coils S1, S2 and E being aligned parallel to the direction of influence 14 of the proximity sensor. The reception coil E is spaced apart by equal distances from the two transmission coils S1 and S2.

The three coils S1, S2 and E are arranged in a sleeve 16 whose longitudinal axis extends in the direction of influence 14 of the proximity sensor.

A target 18 is furthermore shown which is located in the region of influence of the proximity sensor and which is spaced apart from the coils S1, S2 and E in the direction of influence 14.

Also shown in F*ig*. 2 are the excitation device 28 of the proximity sensor which is connected to the transmission coils S1 and S2 and the evaluation device 30 which is connected to at least one of the transmission coils S1 and S2 as well as to the reception coil E.

The two transmission coils S1 and S2 are designed identical in construction and, in the present embodiment, in particular have the same inductivity and the same winding sense. The transmission coils S1 and S2 are excited by the excitation device so that the voltages induced in the reception coil E by the two transmission coils S1 and S2 substantially cancel one another out. The corresponding wiring of the transmission coils S1 and S2 is shown in FIG. 3.

FIG. 3 shows a circuit diagram of the proximity sensor in accordance with the invention of FIG. 2.

The two transmission coils S1 and S2, which are shown in the circuit diagram by their inductivities $L_{S1}$ and $L_{S2}$, are excited with a sinusoidal AC voltage, namely the transmission voltage Us, which is provided between two connections 20 and 22 of the excitation device 28. The two transmission coils S1 and S2 are connected in parallel between the connections 20 and 22.

The two transmission coils S1 and S2 are connected to the transmission voltage Us in opposite polarity with respect to their geometric arrangement in the proximity sensor. The respective ends of the transmission coils S1 and S2 disposed closer to the side of influence 15 of the proximity sensor are marked by a dot next to the corresponding inductivity $L_{S1}$ and $L_{S2}$ respectively in the circuit diagram of FIG. 3. FIG. 3 thus shows that, in the parallel connection of the transmission coils S1 and S2, the end of the first transmission coil S1 disposed closer to the side of influence 15 is connected to the end of the second transmission coil S2 more remote from the side of influence 15 and, conversely, the more remote end of the first transmission coil S1 is connected to the closer end of the second transmission coil. Since the two transmission coils S1 and S2 have an identical winding sense, the end of the first transmission coil S1 rotating to the right viewed in the direction of influence 14 is connected to the end of the second transmission coil S2 rotating to the left viewed in the direction of influence and vice versa.

It is ensured in this manner that the current fed into the transmission coils S1 and S2 by the transmission voltage Us rotates clockwise in the first transmission coil S1 viewed in the direction of influence 14 when it rotates counter-clockwise in the second transmission coil S2 and vice versa, so that the two transmission coils S1 and S2 are, in other words, excited in opposite senses.

Due to the identical geometry and to the identical inductivities $L_{S1}$ and $L_{S2}$ of the two transmission coils S1 and S2 and to their geometric arrangement with respect to the reception coil E, it is achieved by this excitation in opposite senses that the voltages induced in the reception coil E by the first transmission coil S1 and by the second transmission coil S2 cancel one another out so that, in the absence of a target 18, no voltage is induced in the reception coil E, that is the reception voltage $U_E$ becomes zero.

The reception coil E is shown in the circuit diagram of FIG. 3 by its inductivity $L_E$. The voltage dropping over the reception coil E is provided as the reception voltage $U_E$ between the connection 22 and a connection 24. In the present embodiment, the reception voltage $U_E$ is evaluated together with the transmission voltage Us by an evaluation device 30.

A target 18 is furthermore shown in FIG. 3 by the inductivity $L_T$ of the target 18 and by the parallel electrical internal resistance $R_T$ of the target 18.

For the detection of the target 18, in the present embodiment, the phase shift between the transmission voltage Us and the reception voltage $U_E$ is measured in the evaluation unit 30. In the following it will be shown briefly, in particular with reference to FIGS. 4 to 7, how this phase shift is influenced by a target 18 and can be evaluated in the present embodiment.

The inductivity processes are illustrated in FIG. 4 which are due to the mutual inductive coupling of the coils S1, S2 and E of the proximity sensor with one another and with the target 18 and which result in the induction of a reception voltage $U_E$ in the reception coil E.

Basically, the excited transmission coils S1 and S2 or their inductivities $L_{S1}$ and $L_{S2}$ each induce a voltage Sp1 and Sp2 respectively in the reception coil E which can also be called primary signals. In the present embodiment, the two transmission coils S1 and S2 are, as described above, designed, arranged and excited so that the voltages Sp1 and Sp2 just cancel one another out.

In the presence of a target 18, a voltage is induced in the target 18 by the transmission coils S1 and S2. The target 18 then in turn induces a voltage $S_s$ in the reception coil E. This additional induced voltage Ss has a phase shift with respect to the transmission voltage Ss, as will be explained in more detail in the following.

FIG. 5 shows the circuit diagram of FIG. 3, with additionally the inductive couplings of the transmission coils S1 and S2 and of the reception coil E to one another and to the targets, which result in the above-described induction processes, being shown by the corresponding counter-inductivities M1 to M5.

The following differential equations describing the proximity sensor and the target can be set up using these counter-inductivities M1 to M5:

$$U_S = L_{S1}\frac{dI_{S1}}{dt} + M_3\frac{dI_T}{dt}$$

$$U_S = L_{S2}\frac{dI_{S2}}{dt} + M_5\frac{dI_T}{dt}$$

$$U_E = M_1\frac{dI_{S1}}{dt} + M_2\frac{dI_{S2}}{dt} + M_4\frac{dI_T}{dt}$$

$$0 = R_T I_T + L_T\frac{dI_T}{dt} + M_3\frac{dI_{S1}}{dt} + M_5\frac{dI_{S2}}{dt}$$

It must first be taken into account that the two transmission coils S1 and S2 have identical inductivities $L_{S1}$ and $L_{S2}$. It must additionally be taken into account that due to the identical geometry and to the arrangement of the transmission coils S1 and S2, the counter-inductivity M1 between the first transmission coil S1 and the reception coil E is identical to the counter-inductivity M2 between the second transmission coil S2 and the reception coil E. In simplified terms, it is furthermore assumed that the counter-inductivity M5 between the second transmission coil S2 and the target 18 is zero. This simplification is justified because the second transmission coil S2, because of the geometric arrangement of the coils S1, S2, E, is disposed considerably further away from the side of influence 15 of the proximity sensor and is therefore much less strongly inductively coupled to a target 18 approached in the direction of influence. A vanishing of the counter-inductivity M5 could also be effected by a magnetic shielding between the second transmission coil S2 and the target 18. The following relationships result:

$L_{S1} = L_{S2} = L_S$ $M_1 = M_2$ $M_5 = 0$

With the help of the Laplace transform, the transfer function between the transmission voltage Us and the reception voltage $U_E$ in the Laplace domain can be calculated using the Laplace parameter s:

$$\frac{U_E}{U_S} = \frac{s(M_1 M_3^2 - L_S M_4 M_3)}{L_S(R_T L_S + (L_S L_T - M_3^2)s)}$$

The counter-inductivities can now be replaced by the corresponding expressions from inductive coupling factors K1 to K5 and inductivities Ls, $L_T$ and $L_E$:

$$M_1 = K_1 \sqrt{L_S L_E}$$

$$M_3 = K_3 \sqrt{L_S L_T}$$

$$M_4 = K_4 \sqrt{L_E L_T}$$

$$\frac{U_E}{U_S} = \frac{sK_3 L_T (K_1 K_3 - K_4)}{R_T + L_T(1 - K_3^2)s} \sqrt{\frac{L_E}{L_S}}$$

This relationship between the reception voltage $U_E$ and Us in the Laplace representation, called the transfer function, shows that, with a specific combination of coupling factors K1, K3 and K4, namely when the condition K1·K3=K4 is satisfied, the sign of the transfer function changes, i.e. the transfer function has a zero point at K1·K3=K4. In an idealistic case, a step-wise change of the phase shift—a phase step in other words—can occur at this point, which may for example be 180 degrees.

Since the coupling factors K1, K3 and K4 depend on the distance of the targets 18 from the proximity sensor, a change in the sign or, respectively, a zero-point of the transfer function occurs at a specific target distance. The evaluation device 30 can recognize this transition by a measurement of the phase shift and can thus detect the presence of a target 18 at a specific distance. The transmission coils 51, S2 and the reception coil E can now be designed and arranged so that the condition K1·K3=K4, which depends on the target distance, is satisfied if an expected target 18 is located in the direction of influence 14 of the proximity sensor in a preset switching distance from the proximity sensor. The second zero-point of the above transfer function, namely that at K3=0, corresponds to the above-described characteristic of the proximity sensor that the signals induced in the reception coil E by the transmission coils S1, S2, cancel one another out if no target that is inductively coupled with one of the coils is present, in other words if K3=0.

It has to be noted that the above-described exemplary embodiment was chosen, since the essential interrelations can be reduced to few mathematical expressions and the example is therefore particularly illustrative. However, for example also if the condition M5=0 is not satisfied, or, respectively, not satisfied to a sufficiently accurate extent, because of the given design and arrangement of the coils S1, S2, E, the coils S1, S2, E may be designed, arranged and excited so that a zero-point of the transfer-function results at a preset switching distance of a target 18 and/or at the absence of a target. Generally, a multitude of coil arrangements can be conceived of which have a transfer function with such a zero-point even if the transfer function may assume a more complicated mathematical form. To this end, the counter-inductivities of the coils S1, S2, E are to be chosen by means of a corresponding, suitable dimensioning and arrangement of the transmission and reception coils S1, S2, E and of the excitations of the transmission coils S1, S2 such that a corresponding transfer function results.

FIG. 6 shows the circuit diagram of a proximity sensor in accordance with the invention improved even further with respect to the described exemplary embodiment.

In order further to improve the dependence of the phase shift on the transmission voltage Us and on the reception voltage $U_E$ with respect to the detectability of a target 18, in this embodiment, a first electrical resistor $R_1$ is additionally connected in series to the first transmission coil S1 and a second electrical resistor $R_2$ is connected in series to the second transmission coil S2. This embodiment results in a continuous change in the phase shift between the transmission voltage Us and the reception voltage $U_E$ on a change in the distance between the sensor and the target 18 so that the range of the target distances which can be determined by measurement of the phase shift is increased.

The differential equations describing the proximity sensor and the target 18 from FIG. 6 read as follows analog to the calculations described in the above:

$$U_S = I_{S1} R_1 + L_{S1} \frac{dI_{S1}}{dt} + M_3 \frac{dI_T}{dt}$$

$$U_S = I_{S2} R_2 + L_{S2} \frac{dI_{S2}}{dt} + M_5 \frac{dI_T}{dt}$$

$$U_E = M_1 \frac{dI_{S1}}{dt} + M_2 \frac{dI_{S2}}{dt} + M_4 \frac{dI_T}{dt}$$

$$0 = R_T I_T + L_T \frac{dI_T}{dt} + M_3 \frac{dI_{S1}}{dt} + M_5 \frac{dI_{S2}}{dt}$$

Since the coil arrangement of FIG. 6 corresponds to the coil arrangement of FIG. 5 and also here the two transmission coils S1, S2 are excited identically (R1=R2), the relation between the reception voltage $U_E$ and the excitation voltage $U_{LS1}$ or $U_{LS2}$ dropping over a respective excitation coil S1, S2 corresponds to the transfer function $U_E/U_S$ that was described above with reference to FIG. 5 so that it also exhibits a zero-point at K1·K3=K4 and at K3=0. Using the identities and simplifications already described above as well as the fact that the first and the second electrical resistors $R_1$ and $R_2$ used have the same value in the present embodiment, the transfer function between the transmission voltage Us provided by the excitation device and the reception voltage $U_E$ as well as the phase shift φ between both signals can be determined as follows by Laplace transformation:

$$R_1 = R_2$$

$$A = (K_1 K_3 L_1 - L_1 K_4) K_3 L_T \sqrt{L_1 L_E}$$

$$B = K_3 L_T \sqrt{L_1 L_E} \, R_1 K_4$$

$$C = R_1^2 R_T$$

$$D = R_1 L_1 R_T + R_1^2 L_T + R_1 L_1 R_T$$

$$E = R_1 L_1 L_T - K_3^2 R_1 L_1 L_T + R_T L_1^2 + L_T L_1 R_1$$

$$F = L_1^2 L_T - K_3^2 L_1^2 L_T$$

$$\frac{U_E}{U_S} = \frac{s^3 A - s^2 B}{C + sD + s^2 E + s^3 F}$$

$$\varphi = \arctan\left(-\frac{B(\omega D - \omega^3 F) + \omega A(C - \omega^2 E)}{B(C - \omega^2 E) + \omega A(\omega D - \omega^3 F)}\right)$$

FIG. 7 shows the normed curve of a loss resistance R which is generated by the influence of a target 18 and can be measured in a reception coil E and the normed curve of the phase shift φ between the transmission voltage Us and the reception voltage $U_E$ in dependence on the distance off a target 18 spaced apart in the direction of influence 14 from the proximity sensor.

It can clearly be recognized that the gradient of the normed curve of the phase shift, in particular in the range of high target distances, is larger than the corresponding gradient of the curve of the loss resistance. This illustrates that higher switching distances can be achieved with the proximity sensor in accordance with the invention than only by the measurement of a loss resistance, wherein, in the framework of the invention, a detection or evaluation of the signal amplitudes or the loss resistance, respectively, is generally also possible in addition to the detection of the phase shift.

FIG. 8 shows a circuit diagram of a further embodiment of a proximity sensor in accordance with the invention. In this respect, two adjustable electrical resistors $R_1'$ and $R_2'$ are each connected in series to a transmission coil S1 and S2 respectively and two adjustable electrical resistors $R_3'$ and $R_4'$ are connected in parallel in each case to a transmission coil S1 and S2 respectively.

The adjustable electrical resistors make it possible to optimize a curve shown in FIG. 7 of the phase shift between the transmission voltage Us and the reception voltage $U_E$, for example with respect to specific target distances to be detected. In addition, the adjustable electrical resistors enable a deviation in the arrangement of the coils S1, S2 and E from a preset arrangement, for example a not exactly central arrangement of the reception coil E between the transmission coils S1 and S2 due to manufacture-induced deviations to be balanced such that the voltages induced in the reception coil by the two transmission coils S1 and S2 just cancel one another out despite the deviations.

The adjustable electrical resistors can likewise be used to adjust the proximity sensor such that the voltages induced in the reception coil by the two transmission coils S1 and S2 and by a target 18 located at a specific distance in the direction of influence 14 just cancel one another out. This setting of the proximity sensor can be advantageous for specific applications.

FIG. 9 shows a longitudinal section through a further embodiment of a proximity sensor in accordance with the invention in which a first transmission coil S1, a first reception coil E1, a second transmission coil S2 and a second reception coil E2 are arranged behind one another in the direction of influence 14. A magnetic shielding 26 extending perpendicular to the direction of influence 14 is provided between the first coil pair comprising a first transmission coil S1 and a first reception coil E1 and the coil pair comprising a second transmission coil S2 and a second reception coil E2. This magnetic shielding 26 has the result that the second coil pair is only less strongly influenced by the target 18 approached in the direction of influence 14 or, respectively, is inductively less strongly coupled to such a target 18.

FIG. 10 shows a circuit diagram of the proximity sensor of FIG. 9. The first and second transmission coils S1 and S2 are represented by their inductivities $L_{S1}$ and $L_{S2}$. The first and second reception coils E1 and E2 are equally represented by their inductivities $L_{E1}$ and $L_{E2}$. The dots each characterize the end of the respective coil disposed closer to a side of influence 15 of the proximity sensor in accordance with FIG. 9. The first and second transmission coils S1 and S2 which have the same winding sense are connected in parallel such that the end of the first transmission coil 51 disposed closer to the side of influence 15 is connected to the end of the second transmission coil S2 further remote from the side of influence 15 and vice versa. The reception coils E1 and E2 which have opposite winding senses are connected in series so that the end of the first reception coil E1 disposed closer to the side of influence 15 is connected to the end of the second reception coil E2 further remote from the side of influence 15. Generally, the respective other ends of the two reception coils E1 and E2 could also be connected to one another.

The transmission coils S1 and S2 connected in parallel are excited by the excitation device 28 with a transmission voltage Us. It is achieved by this wiring and by the arrangement of the transmission coils S1 and S2 that the sum of the voltages includes in the first and second reception coils E1 and E2 in each case by both transmission coils S1 and S2, that is the reception voltage $U_E$, becomes essentially zero, if no inductively coupled target 18 is present. The transfer function $U_F/U_S$ between the sum $U_E = U_{LE1} + U_{LE2}$ of the reception voltages $U_{LE1}$ and $U_{LE2}$, on the one hand, and the transmission voltage Us, on the other hand, consequently exhibits a zero-point at the absence of a target 18. Furthermore, the transfer function $U_E/Us$ Exhibits a zero-point at a target 18 which is located in the direction of influence 14 of the proximity sensor in a preset switching distance from the proximity sensor.

A target 18 introduced into the region of influence results, in the embodiment shown, in a reception voltage $U_E$ which is phase shifted with respect to the transmission voltage Us.

The evaluation device 30, measures this phase shift between the transmission voltage Us provided by the excitation device 28 and the reception voltage $U_E$ dropping at both coils.

Reference Numeral List 10 coil
12 longitudinal axis
S1 transmission coil
S2 transmission coil
E reception coil
14 direction of influence
15 side of influence
16 sleeve
18 target
$L_{S1}$ inductivity of S1
$L_{S2}$ inductivity of S2
Us transmission voltage
$U_E$ reception voltage
20 connection
22 connection
24 connection
$L_E$ inductivity of a reception coil
$L_T$ inductivity of a target
$R_T$ internal resistance of a target
Sp1 induced voltage
Sp2 induced voltage
Ss induced voltage
M1 counter-inductivity
M2 counter-inductivity
M3 counter-inductivity
M4 counter-inductivity
M5 counter-inductivity
$R_1$ electrical resistor
$R_2$ electrical resistor
$R_1'$ adjustable electrical resistor
$R_2'$ adjustable electrical resistor
$R_3'$ adjustable electrical resistor
$R_4'$ adjustable electrical resistor
26 magnetic shield
28 excitation
30 evaluation device

The invention claimed is:

1. A proximity sensor comprising:
a first transmission coil (S1),
a second transmission coil (S2);
at least one reception coil (E);
a first excitation device (28) which is connected to the first and second transmission coils (S1, S2); and
an evaluation device (30) which is connected to at least one transmission coil (S1, S2) or to the excitation device (28) as well as to the at least one reception coil (E) and is designed to generate an evaluation signal which depends on a phase shift between a signal ($U_s$) of at least one transmission coil (S1, S2) or of the excitation device (28) as well as a signal ($U_E$) of the at least one reception coil (E), wherein the evaluation unit signal is at least approximately proportional to the phase shift, and wherein the transmission coils (S1, S2) are designed, arranged and excited so that and the reception coil (E) is designed and arranged so that a transfer function of the proximity sensor, which represents a relation between a signal ($U_E$) of the reception (E) and a signal ($U_S$) of a transmission coil (S1, S2) in dependence on an approached target (18), has a zero point at a target (18) which is located at a predetermined switching distance from the proximity sensor in a direction of influence (14) of the proximity sensor.

2. The proximity sensor in accordance with claim 1, wherein the first transmission coil (S1) and the second transmission coil (S2) are designed and arranged so that one of the two transmission coils (S1, S2) is inductively coupled more strongly to the target (18) spaced apart from the proximity sensor in the direction of influence (14) of the proximity sensor than the other transmission coil (S1, S2).

3. The proximity sensor in accordance with claim 1, wherein the evaluation device (30) is designed to open or to close a switch in dependence on the evaluation signal when the phase shift exceeds a preset threshold value.

4. The proximity sensor in accordance with claim 1, wherein the evaluation signal is proportional to the phase shift.

5. The proximity sensor in accordance with claim 1, wherein the excitation device (28) is designed to excite at least one transmission coil (S1, S2) with a periodic signal (Us), preferably with an AC voltage signal and particularly preferably with a sinusoidal AC voltage signal.

6. The proximity sensor in accordance with claim 1, wherein the excitation device (28) is designed to excite the first transmission coil (S1) and the second transmission coil (S2) with two excitation signals (Us) of the same amplitude, of the same signal shape and of a phase shift between −5 and 5 degrees, in particular of 0 degrees.

7. The proximity sensor in accordance with claim 1, wherein the excitation device (28) is designed to excite the first transmission coil (S1) with a first excitation signal and to excite the second transmission coil (S2) with a second excitation signal, with the first excitation signal and the second excitation signal having a phase shift between 175 and 185 degrees, in particular of 180 degrees.

8. The proximity sensor in accordance with claim 1, wherein a magnetic shielding (26) is provided which magnetically shields a transmission coil (S1, S2) from the target (18) spaced apart from the proximity sensor in the direction of influence (14).

9. The proximity sensor in accordance claim 1, wherein the first transmission coil (S1) and the second transmission coil (S2) and the at least one reception coil (E) are arranged at least substantially coaxially, in particular with the common axis of the coils (S1, S2, E) extending at least substantially parallel to the direction of influence (14) of the proximity sensor.

10. The proximity sensor in accordance with claim 1, wherein the at least one reception coil (E) is spaced apart by an at least substantially equal distance from the first transmission coil (S1) and from the second transmission coil (S2).

11. The proximity sensor in accordance with claim 1, wherein the first transmission coil (S1) and the second transmission coil (S2) have an identical inductivity ($L_{S1}$, $L_{S2}$) and are in particular at least substantially identical in construction.

12. The proximity sensor in accordance with claim 1, wherein the first and the second transmission coils (S1, S2) are dimensioned and are arranged relative to one another and to the at least one reception coil (E) and moreover the first and second transmission coils (S1, S2) are excited by the excitation device (28) so that the voltages induced in the reception coil (E) by the first transmission coil (S1) and the voltages induced by the second transmission coil (S2) at least substantially cancel one another out.

13. The proximity sensor in accordance with claim 1, wherein the first transmission coil (S1) and the second transmission coil (S2) are wound and the winding sense of the first transmission coil (S1) is opposite to the winding sense of the second transmission coil (S2).

14. The proximity sensor in accordance with claim 1, wherein the excitation device (28) provides at least one excitation signal (Us) between a first and a second connection (20, 22) and the first transmission coil (S1) and the second transmission coil (S2) are connected electrically in parallel between the first and the second connections (20, 22).

15. The proximity sensor in accordance with claim 14, wherein the electrical parallel connection of the first and second transmission coils (S1, S2) is comprised of a parallel connection of a first series connection with a second series connection, with the first series connection including the first transmission coil (S1) and a first electrical resistor ($R_1$, $R_1'$) connected in series to the first transmission coil (S1) and the second series connection including the second transmission coil (S2) and a second electrical resistor ($R_2$, $R_2'$) connected in series to the second transmission coil (S2), with in particular the first or the second electrical resistor ($R_1'$, $R_2'$) being an adjustable electrical resistor.

16. The proximity sensor in accordance with claim 1, wherein a third electrical resistor ($R_3$, $R_3'$) is connected electrically in parallel to the first transmission coil (S1) and a fourth electrical resistor ($R_4$, $R_4'$) is connected electrically in parallel to the second transmission coil (S4), with in particular the third or fourth electrical resistors ($R_3'$, $R_4'$) being an adjustable electrical resistor.

17. The proximity sensor in accordance with claim 1, wherein a first reception coil (E1) and a second reception coil (E2) are provided, with in particular the first and second transmission coils (S1, S2) and the first and second reception coils (E1, E2) being arranged behind one another in the direction of influence (14).

18. The proximity sensor in accordance with claim 17, wherein the first and second reception coils (E1, E2) are connected electrically in series.

19. The proximity sensor in accordance with claim 17, wherein the first transmission coil (S1) and the first reception coil (E1) form a coil pair and the second transmission coil (S2) and the second reception coil (E2) form a coil pair; and wherein one of the coil pairs is arranged so that it is inductively coupled less strongly to a target (18) located in the region of influence than the second coil pair.

20. The proximity sensor in accordance with claim 17, wherein the excitation device excites the first and second transmission coils (S1, S2) and the transmission coils (S1, S2) and the reception coils (E1,E2) are arranged and dimensioned with respect to one another so that the sum of the voltages which are induced in the first and second reception coils (E1, E2) in each case by the two transmission coils (S1,S2) become at least essentially zero.

\* \* \* \* \*

UNITED STATES PATENT AND TRADEMARK OFFICE
CERTIFICATE OF CORRECTION

PATENT NO. : 8,441,251 B2  
APPLICATION NO. : 12/705069  
DATED : May 14, 2013  
INVENTOR(S) : Thoss et al.

Page 1 of 1

It is certified that error appears in the above-identified patent and that said Letters Patent is hereby corrected as shown below:

In the Claims

Claim 1, column 17, line 10

Please insert --coil-- between "reception" and "(E)".

Signed and Sealed this  
Seventeenth Day of September, 2013

Teresa Stanek Rea  
*Deputy Director of the United States Patent and Trademark Office*